US012658974B2

(12) United States Patent
Kurvathodil et al.

(10) Patent No.: US 12,658,974 B2
(45) Date of Patent: Jun. 16, 2026

(54) NFC DEVICE AND METHOD OF OPERATING AN NFC DEVICE

(71) Applicant: NXP B.V., Eindhoven (NL)

(72) Inventors: Manoj Kurvathodil, Graz (AT); Julia Ziegerhofer, Graz (AT)

(73) Assignee: NXP B.V., Eindhoven (NL)

( * ) Notice: Subject to any disclaimer, the term of this patent is extended or adjusted under 35 U.S.C. 154(b) by 371 days.

(21) Appl. No.: 18/452,905

(22) Filed: Aug. 21, 2023

(65) Prior Publication Data

US 2024/0063847 A1 Feb. 22, 2024

(30) Foreign Application Priority Data

Aug. 22, 2022 (EP) .................................... 22191525

(51) Int. Cl.
| | |
|---|---|
| *H04B 5/00* | (2024.01) |
| *G01R 19/02* | (2006.01) |
| *H04B 5/48* | (2024.01) |

(52) U.S. Cl.
CPC .............. *H04B 5/48* (2024.01); *G01R 19/02* (2013.01)

(58) Field of Classification Search
CPC ... H04B 1/40; H04B 1/51; H04B 5/45; H04B 5/48; H04B 17/101; H04B 17/11; H04B 17/201; H04B 17/22; H04B 17/346
See application file for complete search history.

(56) References Cited

U.S. PATENT DOCUMENTS

| | | | | |
|---|---|---|---|---|
| 3,617,998 A | * | 11/1971 | Freedman ............... | G01S 7/534 |
| | | | | 367/901 |
| 8,805,313 B2 | * | 8/2014 | Da Silva ................ | H04B 17/20 |
| | | | | 455/226.1 |
| 11,585,892 B1 | * | 2/2023 | Spaulding ............. | G01S 7/4021 |
| 2010/0033257 A1 | * | 2/2010 | Pellerano ............... | H03L 7/099 |
| | | | | 331/1 A |

(Continued)

FOREIGN PATENT DOCUMENTS

EP 0358342 A1 3/1990

OTHER PUBLICATIONS

Bhattacharya, S., "Use of Embedded Sensors for Built-In-Test of RF Circuits", 2004 International Conference on Test, Oct. 26-28, 2004.

(Continued)

*Primary Examiner* — Tuan Pham

(57) ABSTRACT

In accordance with a first aspect of the present disclosure, a near field communication (NFC) device is provided, comprising: an NFC transceiver configured to communicate with an external NFC device and to apply at least one transceiver parameter when communicating with the external NFC device; a calibration unit operatively coupled to the NFC transceiver and configured to calibrate the NFC transceiver; wherein the calibration unit is configured to calibrate the NFC transceiver by causing the NFC transceiver to apply different values of the transceiver parameter, measuring a noise level in the NFC transceiver for each applied value of the transceiver parameter, and selecting an optimal value from the applied values of the transceiver parameter in dependence on the noise level measured for each applied value. In accordance with a second aspect of the present disclosure, a corresponding method of operating an NFC device is conceived.

20 Claims, 11 Drawing Sheets

(56)  References Cited

U.S. PATENT DOCUMENTS

| | | |
|---|---|---|
| 2010/0099363 A1 | 4/2010 | Faust et al. |
| 2014/0273828 A1 | 9/2014 | Yang et al. |
| 2015/0249510 A1 | 9/2015 | Dhayni |
| 2015/0256224 A1* | 9/2015 | Shana'a ................. H04B 17/12 |
| | | 455/41.1 |
| 2016/0066131 A1 | 3/2016 | Royston |

OTHER PUBLICATIONS

Davidson, J., "Average vs RMS meters for measuring noise", IRE Transactions on Audio, vol. AU-9, Issue 4, Jul.-Aug. 1961.

Dicke, R., "The Measurement of Thermal Radiation at Microwave Frequencies", The Review of Scientific Instruments, vol. 17, No. 7, Jul. 1946.

Han. D., "Robust Built-In Test of RF ICs Using Envelope Detectors", Proceedings of the 14th Asian Test Symposium (ATS '05), Dec. 18-21, 2005.

Strom, L., "The theoretical sensitivity of the Dicke radiometer", Wescon/57 Conference Record, Aug. 20-23, 1957.

Tiuri, M., "Radio Astronomy Receivers", IEEE Transactions on Antennas and Propagation, vol. 12, Issue 7, Publication Dec. 1964.

Van Vleck, J., "The Spectrum of Clipped Noise", Proceedings of the IEEE, vol. 54, No. 1, Jan. 1966.

* cited by examiner

202

<u>202</u>
Calibrating, by a calibration unit comprised in an NFC device, an NFC transceiver comprised in the NFC device, wherein said calibrating comprises causing the NFC transceiver to apply different values of at least one transceiver parameter, measuring a noise level in the NFC transceiver for each applied value of the transceiver parameter, and selecting an optimal value from the applied values of the transceiver parameter in dependence on the noise level measured for each applied value <u>204</u>
Communicating, by the NFC transceiver, with an external NFC device and applying the at least one transceiver parameter when communicating with the external NFC device

FIG. 2

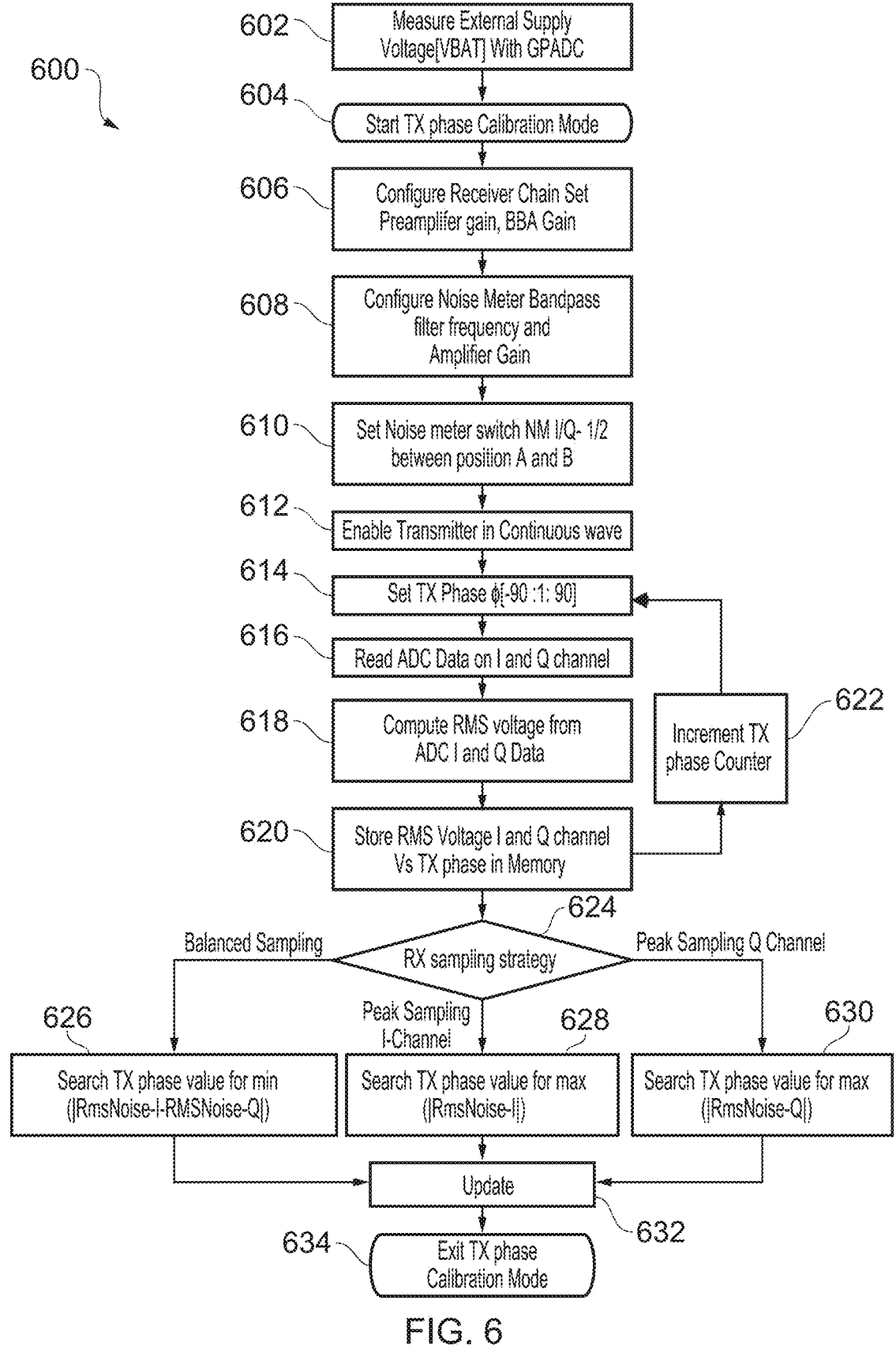

602 — Measure External Supply Voltage[VBAT] With GPADC

604 — Start TX phase Calibration Mode

606 — Configure Receiver Chain Set Preamplifier gain, BBA Gain

608 — Configure Noise Meter Bandpass filter frequency and Amplifier Gain

610 — Set Noise meter switch NM I/Q- 1/2 between position A and B

612 — Enable Transmitter in Continuous wave

614 — Set TX Phase φ[-90 :1: 90]

616 — Read ADC Data on I and Q channel

618 — Compute RMS voltage from ADC I and Q Data

620 — Store RMS Voltage I and Q channel Vs TX phase in Memory

622 — Increment TX phase Counter

624 — RX sampling strategy

Balanced Sampling

Peak Sampling Q Channel

Peak Sampling I-Channel

626 — Search TX phase value for min (|RmsNoise-I-RMSNoise-Q|)

628 — Search TX phase value for max (|RmsNoise-I|)

630 — Search TX phase value for max (|RmsNoise-Q|)

632 — Update

634 — Exit TX phase Calibration Mode

FIG. 6

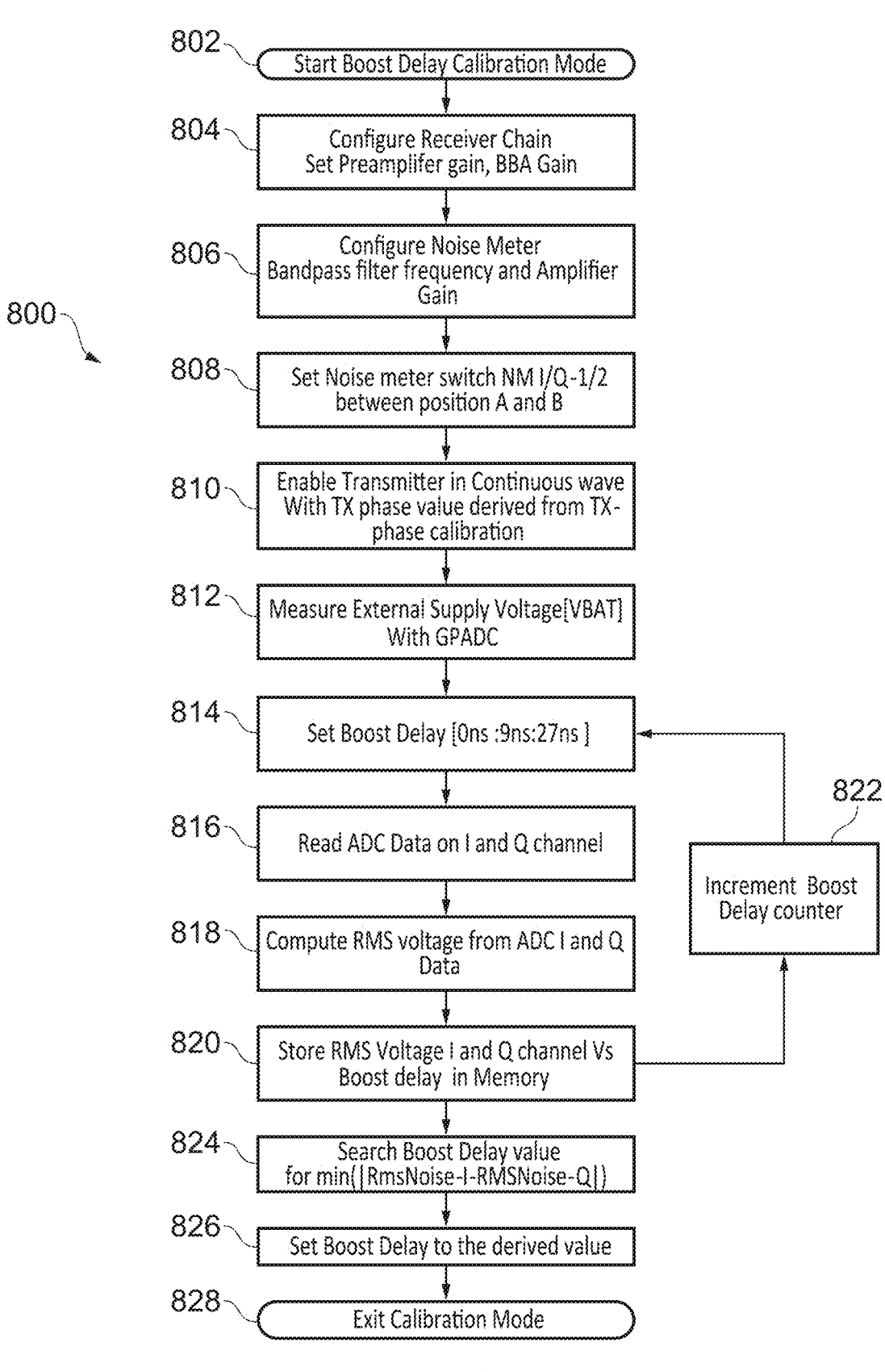

802 — Start Boost Delay Calibration Mode

804 — Configure Receiver Chain
Set Preamplifer gain, BBA Gain

806 — Configure Noise Meter
Bandpass filter frequency and Amplifier
Gain

808 — Set Noise meter switch NM I/Q-1/2
between position A and B

810 — Enable Transmitter in Continuous wave
With TX phase value derived from TX-
phase calibration 812 — Measure External Supply Voltage[VBAT]
With GPADC 814 — Set Boost Delay [0ns :9ns:27ns ]

816 — Read ADC Data on I and Q channel

818 — Compute RMS voltage from ADC I and Q
Data

820 — Store RMS Voltage I and Q channel Vs
Boost delay  in Memory

822 — Increment  Boost
Delay counter

824 — Search Boost Delay value
for min(|RmsNoise-I-RMSNoise-Q|)

826 — Set Boost Delay to the derived value

828 — Exit Calibration Mode

NFC DEVICE AND METHOD OF OPERATING AN NFC DEVICE

CROSS-REFERENCE TO RELATED APPLICATIONS

This application claims the priority under 35 U.S.C. § 119 of European Patent application no. 22191525.9, filed on 22 Aug. 2022, the contents of which are incorporated by reference herein.

TECHNICAL FIELD

The present disclosure relates to a near field communication (NFC) device. Furthermore, the present disclosure relates to a corresponding method of operating an NFC device.

BACKGROUND

NFC refers to a set of communication protocols that enable two electronic devices to establish communication by bringing them within proximity of each other. The communication range of NFC is typically in the order of centimeters (e.g., 10 centimeters or less). NFC technology can be used to carry out various transactions, such as transactions for accessing buildings, transactions for accessing public transportation sites or vehicles, and payment transactions.

SUMMARY

In accordance with a first aspect of the present disclosure, a near field communication (NFC) device is provided, comprising: an NFC transceiver configured to communicate with an external NFC device and to apply at least one transceiver parameter when communicating with the external NFC device; a calibration unit operatively coupled to the NFC transceiver and configured to calibrate the NFC transceiver; wherein the calibration unit is configured to calibrate the NFC transceiver by causing the NFC transceiver to apply different values of the transceiver parameter, measuring a noise level in the NFC transceiver for each applied value of the transceiver parameter, and selecting an optimal value from the applied values of the transceiver parameter in dependence on the noise level measured for each applied value.

In one or more embodiments, the noise level in the NFC transceiver is a root mean square (RMS) noise level.

In one or more embodiments, the calibration unit comprises at least one square-law detector configured to measure the RMS noise level.

In one or more embodiments, the square-law detector comprises a diode configured to operate in a square-law range.

In one or more embodiments, the calibration unit further comprises at least one amplifier operatively coupled to an input of the square-law detector.

In one or more embodiments, the calibration unit further comprises at least one bandpass filter operatively coupled to an input of the amplifier.

In one or more embodiments, the calibration unit further comprises at least one analog-to-digital converter operatively coupled to an output of the square-law detector.

In one or more embodiments, the calibration unit further comprises a digital processing unit operatively coupled to an output of the analog-to-digital converter.

In one or more embodiments, the calibration unit comprises a first part and a second part, each of the first part and the second part comprising a square-law detector, amplifier, bandpass filter and analog-to-digital converter, wherein the first part is integrated into an I-channel receiver path of the NFC transceiver and the second part is integrated into a Q-channel receiver path of the NFC transceiver.

In one or more embodiments, the transceiver parameter includes at least one of the group of: a transmitter phase, a receiver sampling point, a phase delay of a DC-to-DC converter.

In accordance with a second aspect of the present disclosure, a method of operating a near field communication (NFC) device is conceived, comprising: calibrating, by a calibration unit comprised in the NFC device, an NFC transceiver comprised in the NFC device; communicating, by the NFC transceiver, with an external NFC device and applying at least one transceiver parameter when communicating with the external NFC device; wherein said calibrating comprises causing the NFC transceiver to apply different values of the transceiver parameter, measuring a noise level in the NFC transceiver for each applied value of the transceiver parameter, and selecting an optimal value from the applied values of the transceiver parameter in dependence on the noise level measured for each applied value.

In one or more embodiments, the noise level in the NFC transceiver is a root mean square (RMS) noise level.

In one or more embodiments, the RMS noise level is measured by at least one square-law detector comprised in the calibration unit.

In one or more embodiments, the square-law detector comprises a diode operating in a square-law range.

In one or more embodiments, the transceiver parameter includes at least one of the group of: a transmitter phase, a receiver sampling point, a phase delay of a DC-to-DC converter.

DESCRIPTION OF DRAWINGS

Embodiments will be described in more detail with reference to the appended drawings.

FIG. 2 shows an illustrative embodiment of a method of operating an NFC device.

FIG. 6 shows another illustrative embodiment of a method of operating an NFC device.

FIG. 8 shows a further illustrative embodiment of a method of operating an NFC device with balanced sampling.

DESCRIPTION OF EMBODIMENTS

As mentioned above, NFC refers to a set of communication protocols that enable two electronic devices to establish communication by bringing them within proximity of each other. The communication range of NFC is typically in the order of centimeters (e.g., 10 centimeters or less). NFC technology can be used to carry out various transactions, such as transactions for accessing buildings, transactions for accessing public transportation sites or vehicles, and payment transactions.

The performance of an NFC device may be negatively affected by noise. In particular, noise presented to the digital decoder of an NFC device may impact the communication performance of the NFC device. It may be difficult to avoid this negative impact on the performance of the NFC device.

Now discussed are an NFC device and a corresponding method of operating an NFC device, which facilitate avoiding that the NFC device is negatively affected by noise, or which at least facilitate that the negative impact of noise on the performance of the NFC device is reduced.

Figure 1:
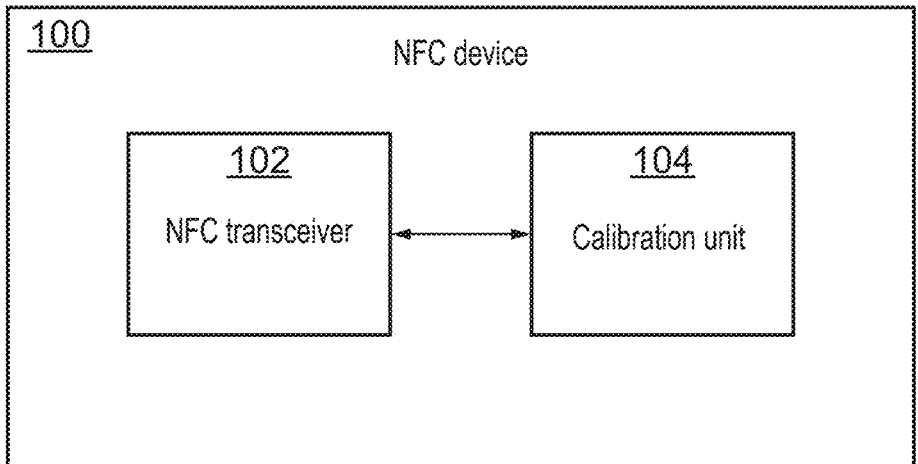
FIG. 1 shows an illustrative embodiment of an NFC device.

FIG. 1 shows an illustrative embodiment of an NFC device 100. The NFC device comprises an NFC transceiver 102 and a calibration unit 104 which are operatively coupled to each other. It is noted that, although the NFC transceiver 102 and calibration unit 104 are shown as separate units, they may in practice be integrated with each other. For instance, as will be shown with reference to FIG. 3, parts of the calibration unit 104 may be embedded within a receiver block of the NFC transceiver 102. The NFC transceiver 102 is configured to communicate with an external NFC device (not shown) and to apply at least one transceiver parameter when communicating with the external NFC device. In this context, an "external NFC device" refers to a device which is external to the NFC device 100 shown in FIG. 1, having communication capabilities which are similar to said NFC device 100. Thus, the external NFC device may be a communication counterpart of the NFC device 100. Furthermore, the calibration unit 104 is configured to calibrate the NFC transceiver by causing the NFC transceiver 102 to apply different values of the transceiver parameter, measuring a noise level in the NFC transceiver 102 for each applied value of the transceiver parameter, and selecting an optimal value from the applied values of the transceiver parameter in dependence on the noise level measured for each applied value. In this way, the NFC transceiver 102 may be properly calibrated, such that a negative impact on its performance due to noise is less likely to occur. For example, in a practical implementation, the optimal value of the transceiver parameters may be the value that results in the lowest noise level. However, other strategies may be applied for selecting an optimal value, in particular if the NFC device 100 is based on an I-Q receiver architecture, as explained in more detail below.

In one or more embodiments, the noise level in the NFC transceiver is a root mean square (RMS) noise level. Calibrating the NFC transceiver in dependence on a RMS noise level further reduces the likelihood of a negative impact on the transceiver's performance. Furthermore, in one or more embodiments, the calibration unit comprises at least one square-law detector configured to measure the RMS noise level. By means of a square-law detector the RMS noise level can easily be measured. In a practical implementation, the square-law detector comprises a diode configured to operate in a square-law range. However, the skilled person will appreciate that the square-law detector may be implemented in a different manner.

In one or more embodiments, the calibration unit further comprises at least one amplifier operatively coupled to an input of the square-law detector. In this way, it may be ensured that the noise level (i.e., the noise voltage) is within the square-law operation of the noise detector. In one or more embodiments, the calibration unit further comprises at least one bandpass filter operatively coupled to an input of the amplifier. In this way, the calibration unit may operate more effectively, because the input of the noise detector may be tuned to the band of interest. In one or more embodiments, the calibration unit further comprises at least one analog-to-digital (ADC) converter operatively coupled to an output of the square-law detector. In this way, the digital processing of the detected noise may be facilitated. To carry out such digital processing, the calibration unit may further comprise a digital processing unit operatively coupled to an output of the ADC. For example, the digital processing unit may execute a computer program which compares and integrates noise level measurement results.

In one or more embodiments, the calibration unit comprises a first part and a second part, each of the first part and the second part comprising a square-law detector, amplifier, bandpass filter and ADC, wherein the first part is integrated into an I-channel receiver path of the NFC transceiver and the second part is integrated into a Q-channel receiver path of the NFC transceiver. This facilitates integrating a calibration unit in NFC transceivers based on I-Q receiver architectures. Furthermore, in one or more embodiments, the transceiver parameter includes at least one of the group of: a transmitter phase, a receiver sampling point, a phase delay of a DC-to-DC converter. These are particularly suitable parameters for calibrating the NFC transceiver, because the noise in the NFC transceiver, in particular the noise presented to a digital decoder of said NFC transceiver, strongly correlates with them. In particular, this noise strongly correlates with settings of a transmitter phase, receiver sampling point and the phase delay of the DC-to-DC converter. So, to have an optimum system performance, the receiver noise levels may be minimized by finding optimal values (i.e., low-noise values) for these settings. As mentioned above, the RMS value of the receiver noise may be used for this optimization.

Typically, noise minimization is done by carrying out lab measurements, varying selected parameters and then manually assess the ADC noise via fast Fourier transform (FFT). This optimization is very time-consuming and therefore only done on a small sample size. The derived optimized settings are typically fixed in firmware and delivered to customers. Any deviation in boards or components would require re-definitions of the optimized settings. Overall, these limitations result in higher cost, a longer time to market and increased effort for re-calibration. The presently disclosed NFC device and corresponding operating method may overcome at least some of these limitations. In particular, they may significantly reduce the development effort to validate the system performance with respect to DC-to-DC converter-noise and TX-switching noise as they facilitate executing a built-in self-test (BIST). Furthermore, they may enable a customer to perform an end-of-line noise calibration for each sample to optimize the performance. In addition, the optimization of settings may be possible in real-time, in which case the actual conditions (e.g., battery voltage, temperature) may be taken into account as well. Furthermore, during the lifetime of a product, any degradation in performance due to component aging may be mitigated by a periodic self-calibration cycle. For instance, since the RMS noise measured at the ADC in a receiver chain of an NFC device depends on the transmitter phase, receiver sampling point, and DC-to-DC phase delay, one or more of these parameters may easily be optimized in dependence of the RMS noise, as part of a self-calibration cycle. It is noted that the RMS noise level may be measured in a specified bandwidth in the analog domain of the NFC device. Then, the measured RMS noise may be used as decision criterion to derive the best setting after a parameter variation (e.g., the setting resulting in a low, or the lowest, noise level).

FIG. 2 shows an illustrative embodiment of a method 200 of operating an NFC device. The method 200 comprises the following steps. At 202, a calibration unit comprised in the NFC device calibrates an NFC transceiver comprised in the NFC device, wherein said calibrating comprises causing the NFC transceiver to apply different values of at least one transceiver parameter, measuring a noise level in the NFC transceiver for each applied value of the transceiver parameter, and selecting an optimal value from the applied values of the transceiver parameter in dependence on the noise level measured for each applied value. Furthermore, at 204, the NFC transceiver communicates with an external NFC device and applies the at least one transceiver parameter when communicating with the external NFC device. As mentioned above, in this way the NFC transceiver may be properly calibrated, such that a negative impact on its performance due to noise is less likely to occur.

Figure 3:
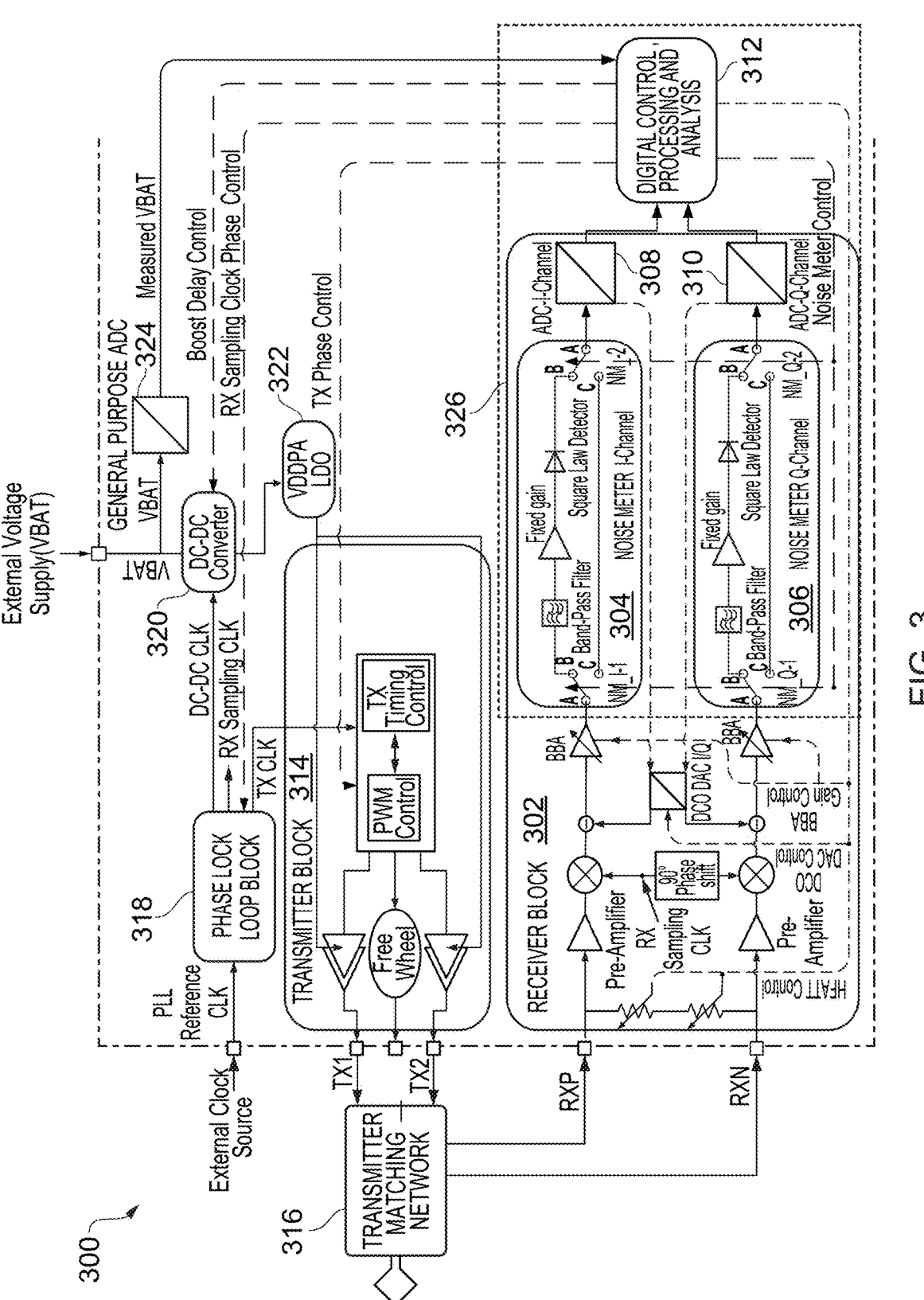
FIG. 3 shows another illustrative embodiment of an NFC device.

FIG. 3 shows another illustrative embodiment of an NFC device 300. In particular, a detailed implementation is shown of the presently disclosed NFC device. The skilled person will appreciate that other implementations of the NFC device are possible as well. In the implementation shown in FIG. 3, the NFC device is based on an I-Q receiver architecture. Therefore, the calibration unit 326 includes a noise meter 304, 306 in each of the I-channel receiver path and in the Q-channel receiver path, as well as an ADC in 308, 310 in each of the I-channel receiver path and in the Q-channel receiver path. Furthermore, the calibration unit 326 comprises a digital control, processing and analysis unit 312 configured to receive the output of both ADCs 308, 310. The noise meters 304, 306 and the ADCs 308, 310 are integrated into a receiver block 302 of the NFC device 300. In addition to the receiver block 302, the NFC device 300 includes a transmitter block 314, a transmitter matching network 316, a phase lock loop block 318, a DC-to-DC converter 320, a supply voltage (VDDPA) low-dropout (LDO) regulator 322, and a general-purpose ADC 324, as shown in FIG. 3.

Each of the noise meters 304, 306 contains a band-pass filter, a fixed-gain amplifier and a square law detector for detecting a RMS noise level in the respective channel. Furthermore, each of the meters 304, 306 contains a pair of switches by means of which the band-pass filter, fixed-gain amplifier and square-law detector may be connected to and disconnected from the respective channel path, thereby effectively enabling and disabling the noise detection function. The digital control, processing and analysis unit 312 is configured to receive the outputs of the ADCs 308, 310 as well as an external supply voltage, e.g., a battery voltage (VBAT), which is measured via the general-purpose ADC 324. Furthermore, the digital control, processing and analysis unit 312 is configured to output the following control signals: a noise meter control signal for controlling the noise meters 304, 306, and control signals for applying different transceiver parameters, i.e., a TX phase control signal to the transmitter block 314, a receiver (RX) sampling clock phase control signal to the phase lock loop block 318, and a boost delay control signal to the DC-to-DC converter 320.

Figure 4:
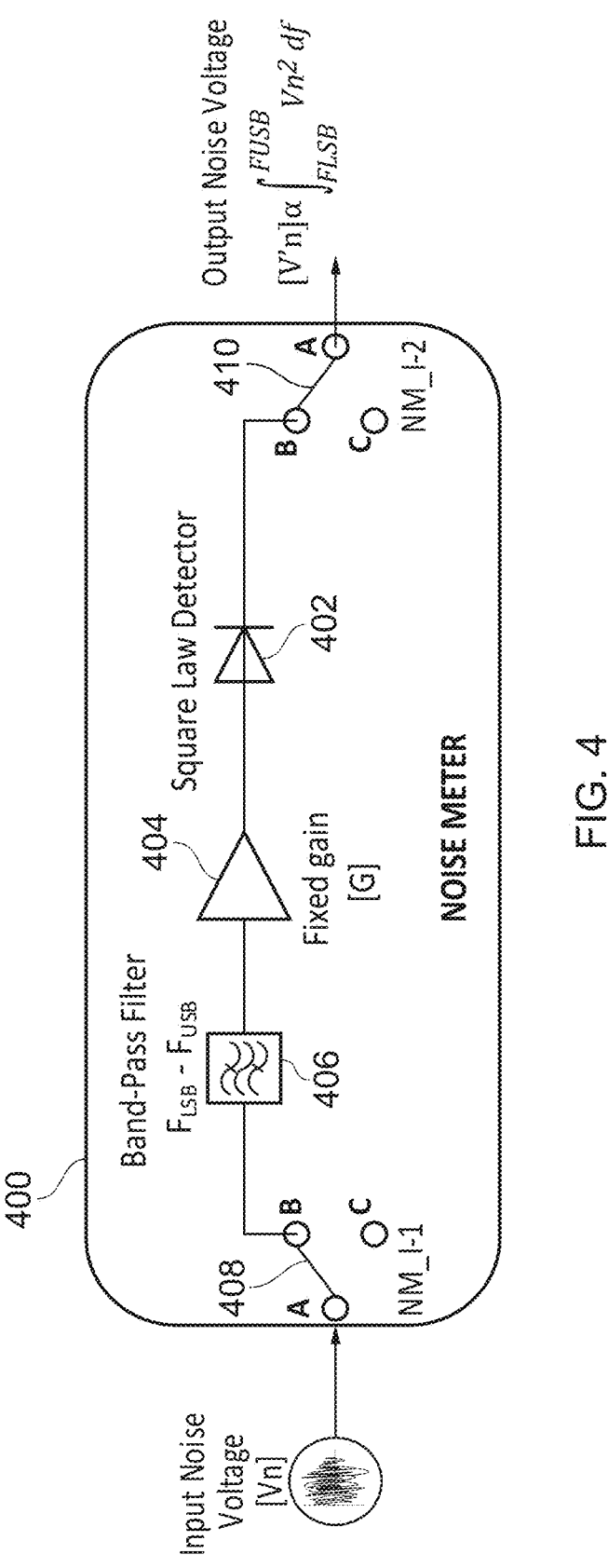
FIG. 4 shows an illustrative embodiment of a noise meter.

FIG. 4 shows an illustrative embodiment of a noise meter 400. In particular, the noise meter 400 shown in FIG. 4 may be integrated into an I-channel receiver path and into a Q-channel receiver path, as shown in FIG. 3. The noise meter 400 includes a square law detector 402 configured to detect a noise level. Furthermore, the noise meter 400 includes a fixed-gain amplifier 404 operatively coupled to an input of the square law detector 402. In addition, the noise meter 400 includes a band-pass filter 406 operatively coupled to an input of the fixed-gain amplifier 404. Furthermore, the noise meter 400 includes a pair of switches 408, 410 by means of which the noise detection function can be enabled and disabled, as mentioned with reference to FIG. 3.

The noise meter 400 may operate in accordance with the following principles. A noise source with an equivalent voltage Vn may represent the receiver front noise. Furthermore, the wideband noise may be filtered to the band of interest by the band-pass filter 406. The fixed-gain amplifier 404 may be used in combination with the square law detector 402. It is noted that the placement and usage of the fixed-gain amplifier 404 may depend on the type of square law detector 402 which is used. The output of the square-law detector 402 may be the equivalent RMS noise depending on the integration time (i.e., the number of samples averaged). This output may be expressed as shown in equation 1.

$$V_n' = \int_{F_{LSB}}^{F_{USB}} V_n^2 df \qquad \text{(Eq. 1)}$$

$$V_{noise_{RMS}} = \sqrt[2]{(V_{n1}' + V_{n2}' + V_{n3}' + \ldots V_{nn}')}$$

Figure 5:
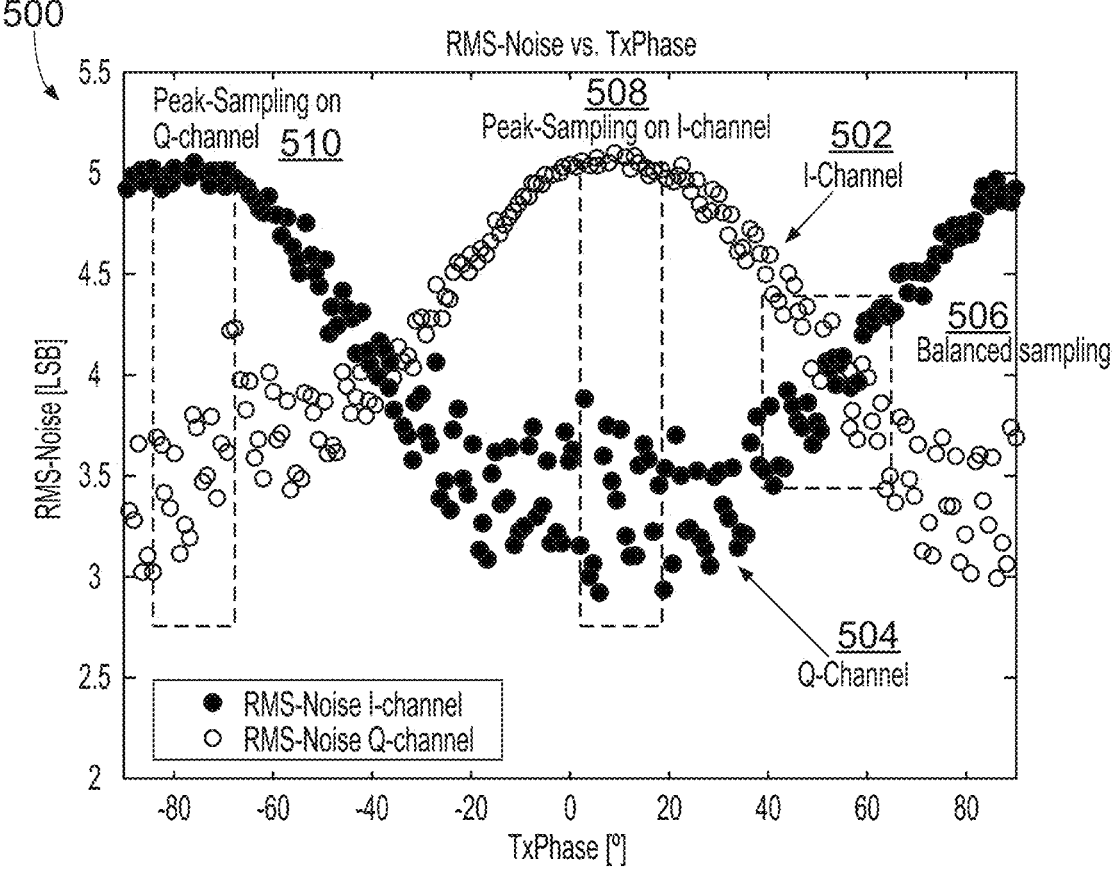
FIG. 5 shows a variation of RMS noise versus a TX phase.
Figure 7A:
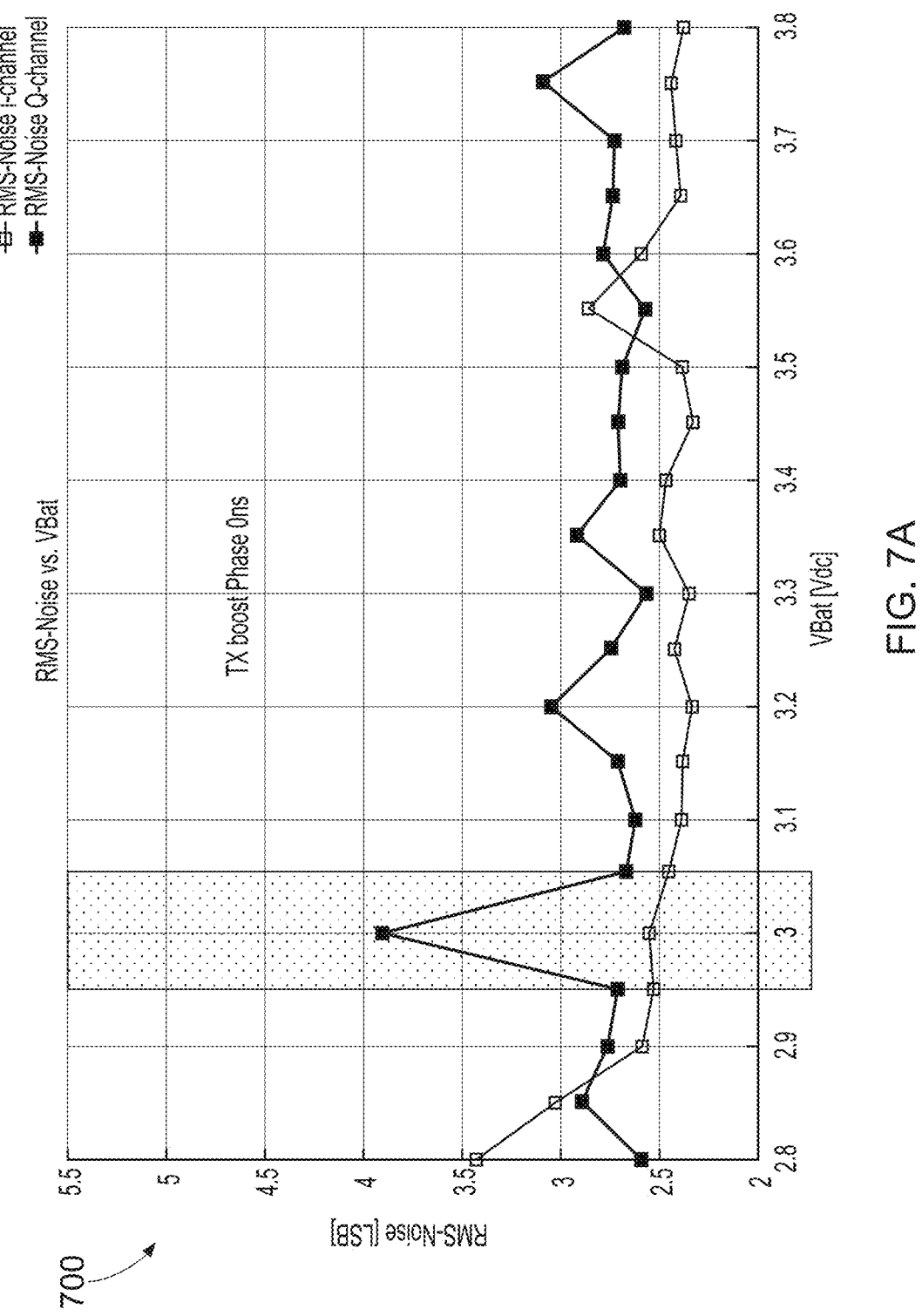
FIG. 7A shows a root mean square (RMS) noise level versus a battery voltage at a transmitter (TX) boost phase of 0 ns.
Figure 7B:
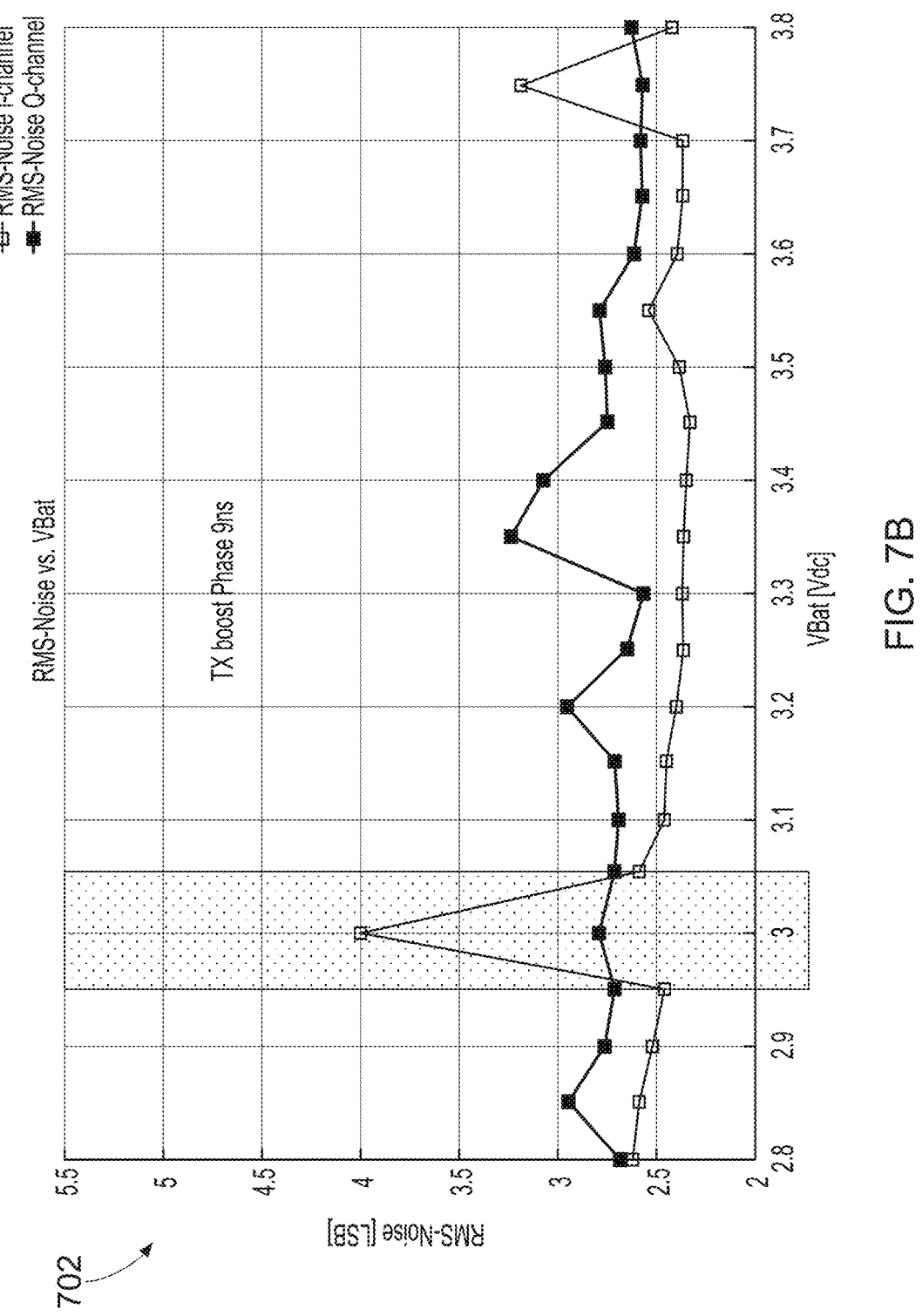
FIG. 7B shows an RMS noise level versus a battery voltage at a TX boost phase of 9 ns.
Figure 7C:
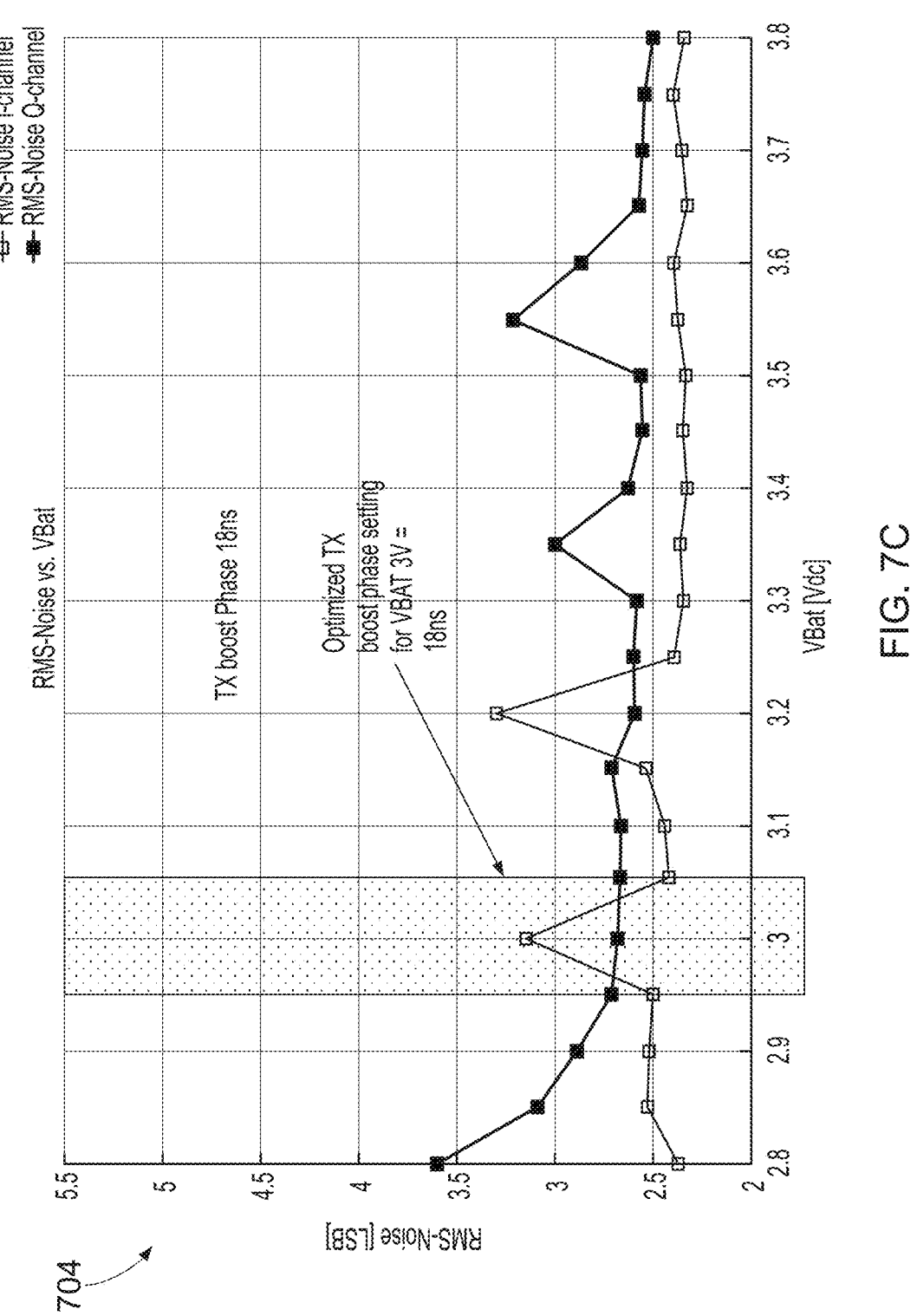
FIG. 7C shows an RMS noise level versus a battery voltage at a TX boost phase of 18 ns.
Figure 7D:
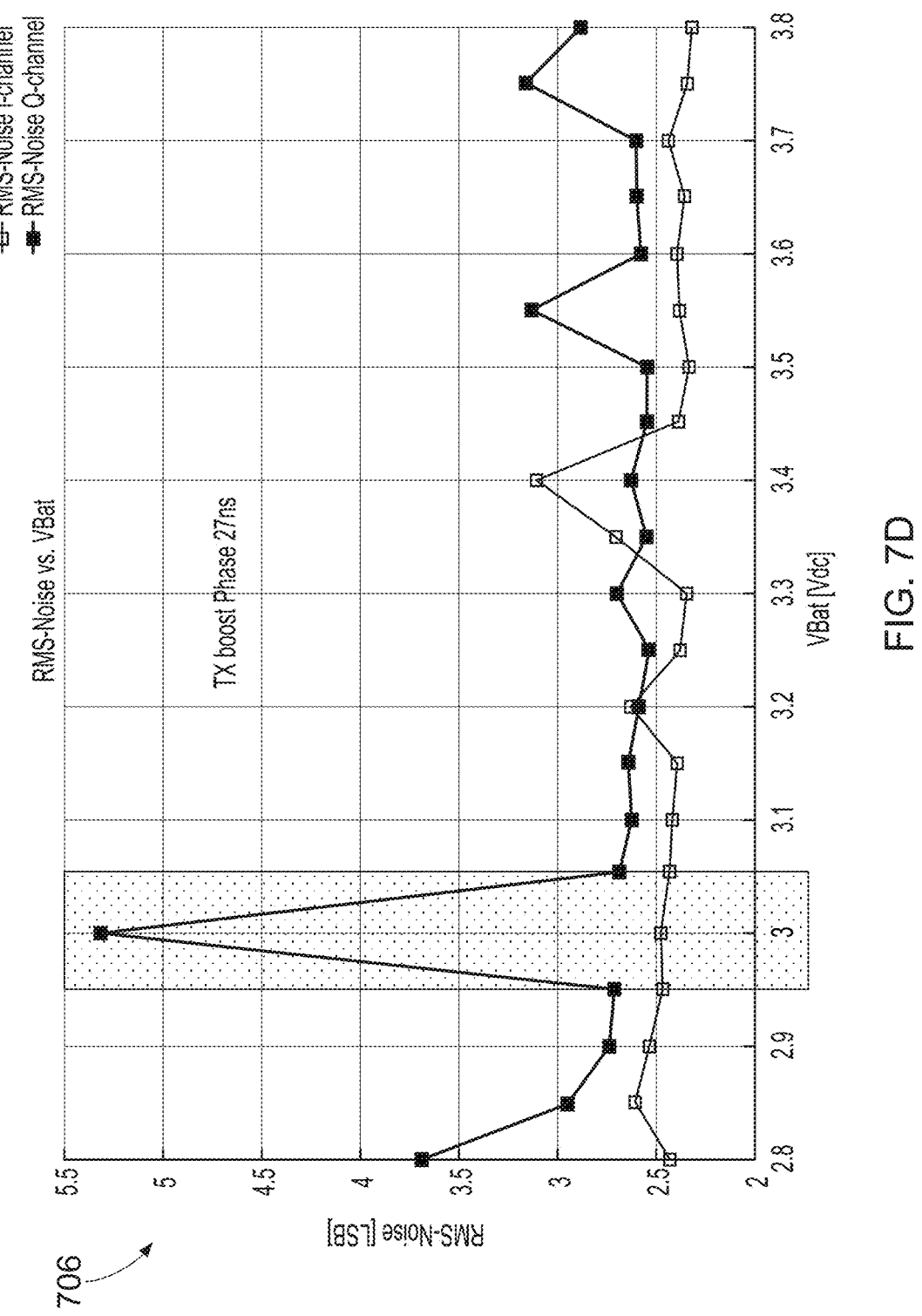
FIG. 7D shows an RMS noise level versus a battery voltage at a TX boost phase of 27 ns.

FIG. 5 shows a variation of RMS noise versus a TX phase 500. In particular, it is shown how the RMS noise measured in the NFC transceiver correlates with one of the transceiver parameters, i.e., the transmitter phase. The fact that the RMS noise strongly correlates with the transmitter phase can be exploited in order to properly calibrate the NFC transceiver. More specifically, it is shown how the RMS noise 502 in the I-channel receiver path of the NFC transceiver correlates with the transmitter phase, and how the RMS noise 504 in the Q-channel receiver path of the NFC transceiver correlates with the transmitter phase. As will be explained with reference to FIG. 6, a value for the transmission phase or phase shift may be chosen according to different receiver sampling strategies, referred to as balanced sampling 506, peak sampling I-channel 508 and peak sampling Q-channel 510. The skilled person will appreciate that the choice of a particular sampling strategy may depend on how the decoder is implemented. Furthermore, it is noted that FIG. 5 shows the least significant bit (LSB) of the noise, i.e., the least significant bit of the ADC in the respective receiver path. The LSB may be defined as shown in equation 2, in which Vref[+] represents the positive reference voltage of the ADC in [V], Vref[−] represents the negative reference voltage of ADC in [V], and N represents the number of bits of the ADC. It is noted that Vref[−]=0V in case of a single-ended reference voltage.

$$LSB = \frac{(V_{ref[+]} - V_{ref[-]})}{2^N} [V] \qquad \text{(Eq. 2)}$$

FIG. 6 shows another illustrative embodiment of a method of operating an NFC device. In particular, a method 600 is shown in which an optimal value for the transmitter (TX) phase is selected. The method 600 comprises the following steps. At 602, the external supply voltage (VBAT) is measured with the general-purpose ADC. At 604, a TX phase calibration mode is started. At 606, the receiver chain of the NFC transceiver is configured, in particular by setting a preamplifier gain and BBA gain. At 608, the noise meter is configured, in particular by setting the bandpass filter frequency and amplifier gain. At 610, the noise meter switches NM I/Q-1/2 are set between position A and B. At 612, the transmitter is enabled in continuous wave. At 614, the TX phase is set to a predefined value. At 616, ADC data are read on the I-channel and Q-channel. At 618, the RMS voltage is, as an example, computed from the I-data and Q-data provided by the respective ADCs. The skilled person will appreciate that another noise indicator may be used instead of the RMS voltage. Then, the measured RMS voltages of the I-channel and Q-channel versus the TX phases are stored 620 in a memory, for example as a table. At 622, the TX phase counter is incremented, and the method returns to step 614. Steps 614, 616, 618 and 620 are repeated until all transmitter phase values have been applied. Subsequently, at 624, a receiver sampling strategy is selected. In case a balanced sampling strategy is selected, step 626 is performed, i.e., searching a TX phase value for min (|RMSNoise-I–RMSNoise-Q|). In case a peak sampling I-channel strategy is selected, step 628 is performed, i.e., searching a TX phase value for max(|RMSNoise-I|). Furthermore, in case a peak sampling Q-channel strategy is performed, step 630 is performed, i.e., searching a phase value for max(|RMSNoise-Q|). At 632, the TX phase is updated with the derived value. Finally, at 634, a step of exiting the TX phase calibration mode is performed.

It is noted that with the TX phase setting, the TX signal ("aggressor") can be shifted with respect to the 13.56 MHz clock to avoid a high impact to victim signals (e.g., a RX sampling point). By measuring the ADC noise for different TX phase values (i.e., TX phase shifts), high and low noise configurations can be identified. If a low noise configuration is chosen, the sensitivity of the receiver may be improved. As a first step in the TX phase calibration mode, the receiver chain and noise meter are configured. Then the transmitter is enabled in continuous wave. A first value for the TX phase shift is applied, and the RMS voltage of the ADC noise is computed for this TX phase setting. The computed RMS voltage and the TX phase are stored in memory, so that they can be accessed later. Then the next TX phase shift is applied, and the RMS voltage measurement is repeated. After the RMS voltage is computed for all TX phase shifts, a value for the TX phase shift is chosen according to the RX sampling strategy. In case of a balanced sampling strategy, a TX phase shift is chosen for which the I-channel and Q-channel have similar RMS values. In case of a peak sampling I-channel strategy, the I-channel is sampled at the maximum, and therefore it has a higher RMS noise, while the Q-channel is sampled at the zero-crossing point and has an RMS noise level close to zero. Then, a TX phase shift is chosen for which the I-channel shows a high RMS noise, while the Q-channel shows a low RMS noise. Similarly, in case of peak sampling Q-channel strategy, the Q-channel is sampled at the maximum, and therefore it has a higher RMS noise, while the I-channel is sampled at the zero-crossing point and has an RMS noise level close to zero. Then, a TX phase shift is chosen for which the Q-channel shows a high RMS noise, while the I-channel shows a low RMS-noise. It is noted that the derived TX phase shift value may be set in firmware, for example.

FIGS. 7A to 7D show a root mean square (RMS) noise level versus VBAT at a transmitter (TX) boost phase (i.e., DC-to-DC converter boost delay value) of 0 ns, 9 ns, 18 ns and 27 ns, respectively. In particular, it is shown that an optimized TX boost phase setting for a VBAT of 3V is 18 ns. The TX boost phase may also be referred to as the DC-to-DC converter boost delay value or the phase delay of the DC-to-DC converter. As mentioned above, the phase delay of the DC-to-DC converter is also a particularly suitable parameter for calibrating the NFC transceiver.

FIG. 8 shows a further illustrative embodiment of a method 800 of operating an NFC device with balanced sampling. In particular, a method 800 is shown in which an optimal value for the DC-to-DC converter boost delay value is selected. The method 800 comprises the following steps. At 802, a boost delay calibration mode is started. At 804, the receiver chain of the NFC transceiver is configured, in particular by setting a preamplifier gain and BBA gain. At 806, the noise meter is configured, in particular by setting the bandpass filter frequency and amplifier gain. At 808, the noise meter switches NM I/Q-1/2 are set between position A and B. At 810, the transmitter is enabled in continuous wave with a TX phase value derived from a TX phase calibration. At 812, the external supply voltage (VBA) is measured with the general-purpose ADC. At 814, a boost delay is set to a predefined value. At 816, ADC data are read on the I-channel and Q-channel. At 818, the RMS voltage is computed from the I-data and Q-data provided by the respective ADCs. At 820, the measured RMS voltages of the I-channel and Q-channel versus the boost delay values are stored in a memory, for example as a table. At 822, the boost delay counter is incremented, and the method returns to step 814. Steps 814, 816, 818 and 820 are repeated until a predefined number of boost delay values has been applied. Subsequently, at 824, a boost delay value is searched based on the applied sampling strategy, i.e., min (|RMSNoise-I–RMS-Noise-Q|) in case of balanced sampling. At 826, the boost delay is set to the derived value. Finally, at 828, a step of exiting the calibration mode is performed.

It is noted that the embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Furthermore, it is noted that the drawings are schematic. In different drawings, similar or identical elements are provided with the same reference signs. Furthermore, it is noted that in an effort to provide a concise description of the illustrative embodiments, implementation details which fall into the customary practice of the skilled person may not have been described. It should be appreciated that in the development of any such implementation, as in any engineering or design project, numerous implementation-specific decisions must be made in order to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

Finally, it is noted that the skilled person will be able to design many alternative embodiments without departing from the scope of the appended claims. In the claims, any reference sign placed between parentheses shall not be construed as limiting the claim. The word "comprise(s)" or "comprising" does not exclude the presence of elements or steps other than those listed in a claim. The word "a" or "an" preceding an element does not exclude the presence of a plurality of such elements. Measures recited in the claims may be implemented by means of hardware comprising several distinct elements and/or by means of a suitably programmed processor. In a device claim enumerating several means, several of these means may be embodied by one and the same item of hardware. The mere fact that certain measures are recited in mutually different dependent claims does not indicate that a combination of these measures cannot be used to advantage.

LIST OF REFERENCE SIGNS

100 NFC device
102 NFC transceiver
104 calibration unit
200 method of operating an NFC device
202 calibrating, by a calibration unit comprised in an NFC device, an NFC transceiver comprised in the NFC device, wherein said calibrating comprises causing the NFC transceiver to apply different values of at least one transceiver parameter, measuring a noise level in the NFC transceiver for each applied value of the transceiver parameter, and selecting an optimal value from the applied values of the transceiver parameter in dependence on the noise level measured for each applied value
204 communicating, by the NFC transceiver, with an external NFC device and applying the at least one transceiver parameter when communicating with the external NFC device
300 NFC device
302 receiver block
304 noise meter I-channel
306 noise meter Q-channel
308 ADC I-channel
310 ADC Q-channel
312 digital control, processing and analysis
314 transmitter block
316 transmitter matching network
318 phase lock loop block
320 DC-to-DC converter
322 VDDPA low-dropout (LDO) regulator
324 general purpose ADC
326 calibration unit
400 noise meter
402 square law detector
404 fixed-gain amplifier
406 band-pass filter
408 switch
410 switch
500 variation of RMS noise versus TX phase
502 I-channel noise
504 Q-channel noise
506 balanced sampling
508 peak sampling on I-channel
510 peak sampling on Q-channel
600 method of operating an NFC device
602 measure external supply voltage (VBAT) with GPADC
604 start TX phase calibration mode
606 configure receiver chain, set preamplifier gain, BBA gain 608 configure noise meter, bandpass filter frequency and amplifier gain
610 set noise meter switch NM I/Q-1/2 between position A and B
612 enable transmitter in continuous wave
614 set TX phase $\varphi[-90{:}1{:}90]$
616 read ADC data on I and Q channel
618 compute RMS voltage from ADC I and Q data
620 store RMS voltage I and Q channel versus TX phase in memory
622 increment TX phase counter
624 RX sampling strategy
626 search TX phase value for min (|RMSNoise-I–RMSNoise-Q|)
628 search TX phase value for max(|RMSNoise-I|)
630 search TX phase value for max(|RMSNoise-Q|)
632 update TX phase with derived value
634 exit TX phase calibration mode
700 RMS noise versus VBat (TX boost phase 0 ns)
702 RMS noise versus VBat (TX boost phase 9 ns)
704 RMS noise versus VBat (TX boost phase 18 ns)
706 RMS noise versus VBat (TX boost phase 27 ns)
800 method of operating an NFC device
802 start boost delay calibration mode
804 configure receiver chain, set preamplifier gain, BBA gain
806 configure noise meter, bandpass filter frequency and amplifier gain
808 set noise meter switch NM I/Q-1/2 between position A and B
810 enable transmitter in continuous wave with TX phase value derived from TX phase calibration
812 measure external supply voltage (VBAT) with GPADC
814 set boost delay [0 ns:9 ns:27 ns]
816 read ADC data on I and Q channel
818 compute RMS voltage from ADC I and Q data
820 store RMS voltage I and Q channel versus boost delay in memory
822 increment boost delay counter
824 search boost delay value for min (|RMSNoise-I–RMSNoise-Q|)
826 set boost delay to the derived value
828 exit calibration mode

The invention claimed is:

1. A near field communication, NFC, device, comprising:
an NFC transceiver configured to communicate with an external NFC device and to apply at least one transceiver parameter when communicating with the external NFC device;
a calibration unit operatively coupled to the NFC transceiver and configured to calibrate the NFC transceiver;
wherein the calibration unit is configured to calibrate the NFC transceiver by causing the NFC transceiver to apply different values of the transceiver parameter, measuring a noise level in the NFC transceiver for each applied value of the transceiver parameter, and selecting an optimal value from the applied values of the transceiver parameter in dependence on the noise level measured for each applied value;
wherein the calibration unit comprises a first part and a second part, each of the first part and the second part arranged with a respective noise meter to facilitate measuring the noise level, wherein the first part is integrated into an I-channel receiver path of the NFC transceiver to measure noise level of the I-channel receiver path and the second part is integrated into a Q-channel receiver path of the NFC transceiver to measure noise level of the Q-channel receiver path.

2. The NFC device of claim 1, wherein the noise level in the NFC transceiver is a root mean square, RMS, noise level.

3. The NFC device of claim 2, wherein the calibration unit comprises at least one square-law detector configured to measure the RMS noise level.

4. The NFC device of claim 3, wherein the square-law detector comprises a diode configured to operate in a square-law range.

5. The NFC device of claim 3, wherein the calibration unit further comprises at least one amplifier operatively coupled to an input of the square-law detector.

6. The NFC device of claim 5, wherein the calibration unit further comprises at least one bandpass filter operatively coupled to an input of the amplifier.

7. The NFC device of claim 3, wherein the calibration unit further comprises at least one analog-to-digital converter operatively coupled to an output of the square-law detector.

8. The NFC device of claim 7, wherein the calibration unit further comprises a digital processing unit operatively coupled to an output of the analog-to-digital converter.

9. The NFC device of claim 3, wherein each of the first part and the second part comprises a square-law detector, amplifier, bandpass filter and analog-to-digital converter.

10. The NFC device of claim 1, wherein the transceiver parameter includes at least one of the group of: a transmitter phase, a receiver sampling point, a phase delay of a DC-to-DC converter.

11. A method of operating a near field communication, NFC, device, comprising:

calibrating, by a calibration unit comprised in the NFC device, an NFC transceiver comprised in the NFC device;

communicating, by the NFC transceiver, with an external NFC device and applying at least one transceiver parameter when communicating with the external NFC device;

wherein said calibrating comprises causing the NFC transceiver to apply different values of the transceiver parameter, measuring a noise level in the NFC transceiver for each applied value of the transceiver parameter, and selecting an optimal value from the applied values of the transceiver parameter in dependence on the noise level measured for each applied value; and wherein the calibration unit comprises a first part and a second part, each of the first part and the second part arranged with a respective noise meter to facilitate measuring the noise level, wherein the first part is integrated into an I-channel receiver path of the NFC transceiver to measure noise level of the I-channel receiver path and the second part is integrated into a Q-channel receiver path of the NFC transceiver to measure noise level of the Q-channel receiver path.

12. The method of claim 11, wherein the noise level in the NFC transceiver is a root mean square, RMS, noise level.

13. The method of claim 12, wherein the RMS noise level is measured by at least one square-law detector comprised in the calibration unit.

14. The method of claim 13, wherein the square-law detector comprises a diode operating in a square-law range.

15. The method of claim 11, wherein the transceiver parameter includes at least one of the group of: a transmitter phase, a receiver sampling point, a phase delay of a DC-to-DC converter.

16. The method of claim 13, wherein the calibration unit further comprises at least one amplifier operatively coupled to an input of the square-law detector.

17. The method of claim 16, wherein the calibration unit further comprises at least one bandpass filter operatively coupled to an input of the amplifier.

18. The method of claim 13, wherein the calibration unit further comprises at least one analog-to-digital converter operatively coupled to an output of the square-law detector.

19. The method of claim 18, wherein the calibration unit further comprises a digital processing unit operatively coupled to an output of the analog-to-digital converter.

20. The method of claim 13, wherein each of the first part and the second part comprises a square-law detector, amplifier, bandpass filter and analog-to-digital converter.

* * * * *